United States Patent [19]

Takemae

[11] Patent Number: 4,679,214

[45] Date of Patent: Jul. 7, 1987

[54] SHIFT REGISTER FOR REFRESHING A MIS DYNAMIC MEMORY

[75] Inventor: Yoshihiro Takemae, Tokyo, Japan

[73] Assignee: Fujitsu Limited, Kawasaki, Japan

[21] Appl. No.: 648,506

[22] Filed: Sep. 10, 1984

[30] Foreign Application Priority Data

Sep. 20, 1983 [JP] Japan .................. 58-172096

[51] Int. Cl.[4] ............................................. G11C 19/28
[52] U.S. Cl. ..................................... 377/80; 307/480; 307/571; 307/482; 307/578
[58] Field of Search .................. 377/77, 79, 80, 81, 377/72; 307/353, 482, 578, 240, 481, 571

[56] References Cited

U.S. PATENT DOCUMENTS

| | | | |
|---|---|---|---|
| 3,601,637 | 8/1971 | Spence | 307/481 |
| 3,683,203 | 8/1972 | Smith | 377/79 |
| 4,295,055 | 10/1981 | Takemoto et al. | 377/79 |
| 4,341,960 | 7/1982 | Naiff | 377/77 |

FOREIGN PATENT DOCUMENTS 176596 10/1982 Japan .................. 377/77

OTHER PUBLICATIONS

"A 4096-b One Transistor Per Bit Random-Access Memory with Internal Timing and Low Dissipation", by Loek Boonstra et al., IEEE Journal of Solid-State Circuits, vol. 8, SC-8, No. 5, Oct. 1973.

*Primary Examiner*—John S. Heyman
*Assistant Examiner*—Karl Ohralik
*Attorney, Agent, or Firm*—Staas & Halsey

[57] ABSTRACT

A shift register having a simple circuit structure and used, for example, in a dynamic RAM device for a refresh operation. The shift register includes a plurality of circuit stages mutually connected in cascade. Each of the circuit stages includes a first transistor, for a transfer gate, which is turned on and off by a first clock signal and to which is input the output signal of the previous circuit stage. A second transistor is provided whose gate electrode is connected to the output of the first transistor, whose drain or source electrode receives a second clock signal having a different phase from the first clock signal, and whose source or drain electrode outputs an output signal. Each circuit stage also includes a reset circuit for rendering the input portion of the first transistor to a reset condition on the basis of the output signal, thereby sequentially transmitting data through each circuit stage.

9 Claims, 7 Drawing Figures

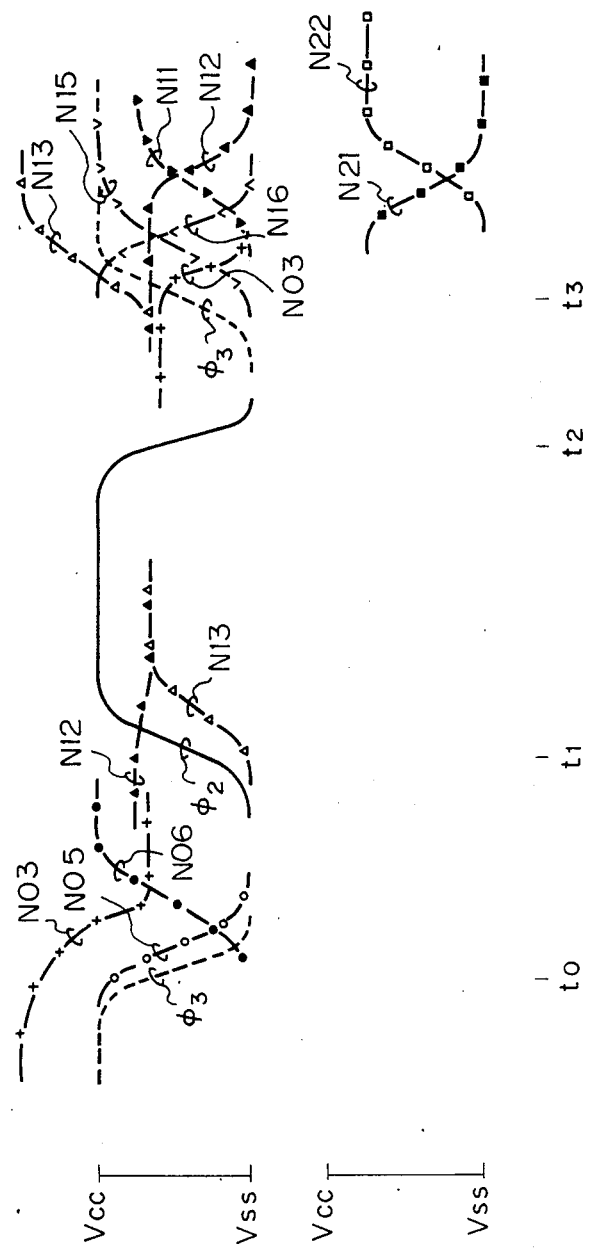

SHIFT REGISTER FOR REFRESHING A MIS DYNAMIC MEMORY

BACKGROUND OF THE INVENTION

The present invention relates to a shift register. More particularly, the present invention is directed to a MIS dynamic shift register which can be composed using a small number of circuit elements.

For example, in a MIS dynamic memory device, the so called auto-refresh operation for refreshing data stored in each memory cell is effected by memorizing the number of a word line to be refreshed in the memory device, and by incrementing the number of the word line and refreshing the memory cells connected to each word line. In Japanese Patent Application No. 58-115887 filed on June 29, 1983 by the present applicant, there is disclosed a memory device which comprises a shift register, disposed parallel to a row decoder and in which a selecting signal for a word line to be refreshed is generated by using the output signal of the shift register, thereby sequentially selecting a word line to be refreshed. The shift register used in such a memory device is characterized in that, among all the bits thereof, the output of only one bit is "1" and the outputs of all the other bits are "0". By using the output of only one "1" bit, only one target word line is selected. It is also necessary that the width of one circuit stage on a semiconductor substrate of the shift register be not larger than the pitch length of the word lines. Generally, since the pitch length of the word lines is very narrow, it is necessary that the structure of each circuit stage of the shift register be very simple and the number of circuit components used therein be small.

In a conventional shift register which can memorize and transmit data having any pattern, each circuit stage has a very complex circuit structure and a large number of circuit components. Therefore, the circuit width of each circuit stage on a semiconductor device is relatively large, and it is impossible to use the shift register in the above-mentioned memory device.

SUMMARY OF THE INVENTION

In view of the problems of the aforementioned conventional shift register, the present invention adopts the idea of forming each circuit stage in a MIS dynamic-type shift register by using three MIS transistors as base components.

It is an object of the present invention to simplify the circuit structure of each circuit stage and to decrease the number of circuit components used in each circuit stage, thereby decreasing the width of the space occupied by each circuit stage on a semiconductor substrate.

According to the present invention, there is provided a shift register having a plurality of circuit stages connected in cascade and receiving first and second clock signals, different in phase from each other, for driving the shift register. Each of the circuit stages comprises: a first transistor, operatively connected to receive an input signal and the first clock signal, for transferring the input signal in response to the first clock signal; a second transistor having a gate operatively connected to receive the input signal, having a source and having a drain, one of the source and drain receiving the second clock signal. The second transistor provides an output signal at the other one of the source and drain in response to the input signal and the second clock signal. A reset circuit resets the input signal applied to the first transistor in response to the output signal. The output signal of the present circuit stage provides the input signal applied to the first transistor of the succeeding stage.

BRIEF DESCRIPTION OF THE DRAWINGS

FIG. 7 is a waveform diagram of the operation of the shift register of FIG. 6.

DESCRIPTION OF THE PREFERRED EMBODIMENTS

Embodiments of the present invention will now be described with reference to the attached drawings.

Figure 1:
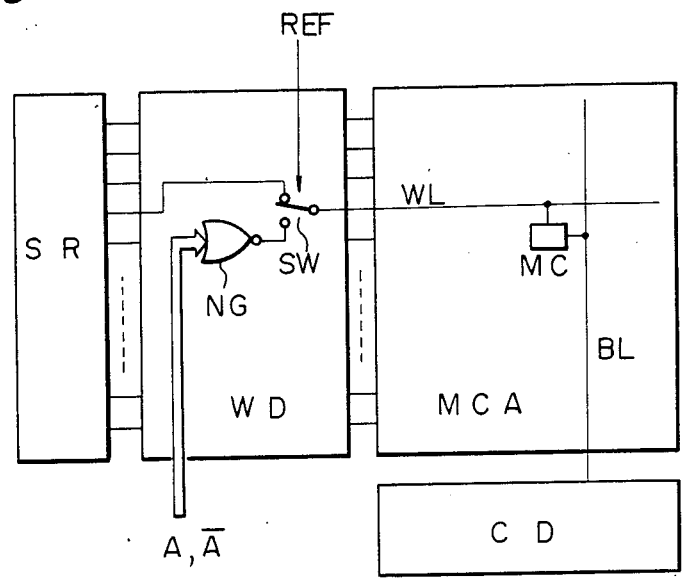
FIG. 1 is a block circuit diagram of a memory device which uses a shift register according to the present invention.

FIG. 1 is a dynamic memory device wherein a shift register is used to sequentially designate a word line connected to memory cells for the purpose of performing a refresh operation. The memory device of FIG. 1 comprises a memory cell array MCA having a plurality of memory cells MC each being connected to a bit line BL and a word line WL, a column decoder CD, a word decoder WD, and the above-mentioned shift register SR. The word decoder comprises a NOR gate NG for decoding address signals and an electronic switch SW for every word line WL.

In the memory device of FIG. 1, a usual access operation, such as a readout operation or write-in operation, is effected when the switch SW is positioned to connect the output of the NOR gate NG to the corresponding word line WL. The word line WL is selected by a decoded signal, i.e., the output signal of the NOR gate NG, and the bit line BL is selected by the column decoder CD. Thus, the memory cell MC is selected and access thereto is performed in a known manner.

The switch SW is controlled by a refresh enable signal REF of, for example, a high potential level, so as to connect each of the output terminals of the shift register SR to the corresponding word lines. The shift register SR cyclically shifts data "1", and sequentially selects a word line, thereby refreshing memory cells connected to each word line.

Figure 2:
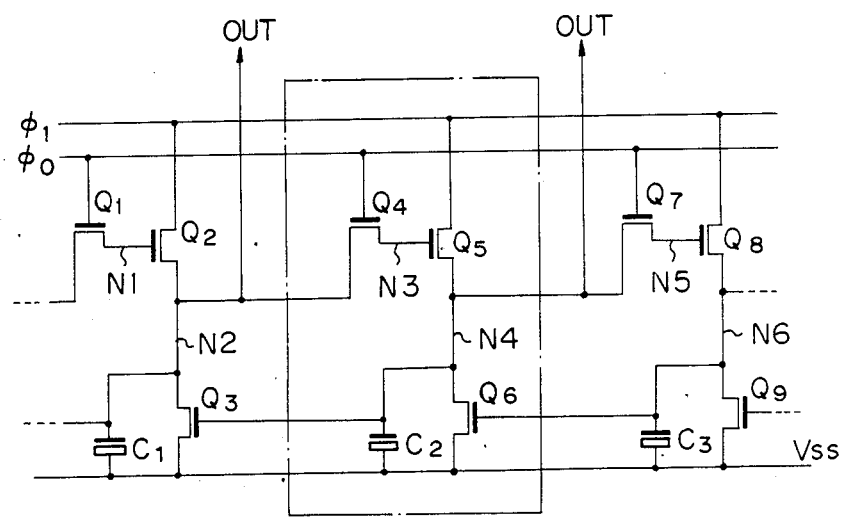
FIG. 2 is a circuit diagram of a shift register as an embodiment of the present invention.

FIG. 2 is of a shift register as an embodiment of the present invention used, for example, in the memory device of FIG. 1. In FIG. 2, the circuit portion surrounded by a dot-dash line includes a circuit of one stage of the shift register, and comprises three MIS transistors $Q_4$, $Q_5$, and $Q_6$, and one capacitor $C_2$.

Figure 3:
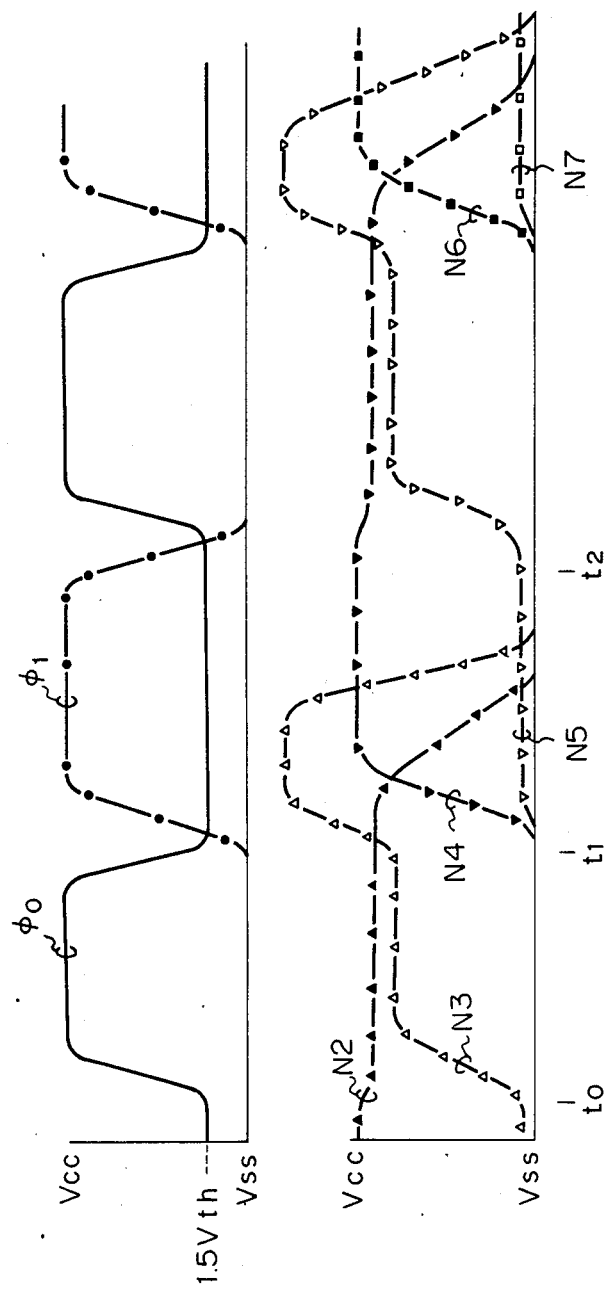
FIG. 3 is a waveform diagram of the operation of the shift register of FIG. 1.

The shift register of FIG. 2 is controlled by two kinds of clock pulses $\phi_0$ and $\phi_1$, and these clock pulses $\phi_0$ and $\phi_1$ have phases mutually different, for example, by 180°, as shown in FIG. 3. The clock pulse $\phi_1$ has an amplitude extending between power supply voltages $V_{SS}$ and $V_{CC}$. However, the voltage of a low level portion of the clock pulse $\phi_0$ is within the range of Vth to 2 Vth and is preferably 1.5 Vth, although the voltage of a high level portion thereof is $V_{CC}$, where Vth is a threshold voltage of the MIS transistor, for example, $Q_4$.

Assume that the potential of an output node N2 of the pre-stage circuit is high, as shown in FIG. 3. At a time $t_0$, the transistor $Q_4$ is turned on in response to the rise up of the clock pulse $\phi_0$ from a low level, i.e., 1.5 Vth, to a high level, and the potential of a node N3 rses to a high level, and the transistor $Q_5$ is turned on. At a time $t_1$, the clock pulse $\phi_0$ falls and the clock pulse $\phi_1$ rises from a low level, i.e., $V_{SS}$, to a high level, i.e., $V_{CC}$, so that node N4 rises to a high level because the transistor $Q_5$ is in an on-state. At this time, the potential of the node N3 rises to a higher potential level in response to the potential rise of the clock pulse $\phi_1$ due to the bootstrap effect of the transistor $Q_5$, so that the node N4 rises to the $V_{CC}$ level as well as the clock level $\phi_1$. When the potential of the node N4 rises, the pre-stage transistor $Q_3$ is turned on, and the potential of the output node N2 of the prestage circuit falls to a low level. At this time, the potential of the clock pulse $\phi_0$ is at a low level, but since the low level potential of the clock pulse $\phi_0$ is 1.5 Vth as mentioned before, when the potential of the node N2 becomes lower than $\frac{1}{2}$ Vth, the transistor $Q_4$ is turned on, thereby pulling down the potential of the node N3 rapidly. In this way, transmission of the high level potential from the node N2 to the node N4 is effected, and, similarly, the high level potential is sequentially transmitted through each circuit stage. The capacitor $C_2$ is provided so as to decrease the voltage loss caused when electric charges are transmitted from a pre-stage to a succeeding stage by rendering the capacitance of the output node N4 sufficiently larger than that of the input circuit, i.e. the node N5 of the succeeding stage. Since the low level voltage of the clock pulse $\phi_0$ is 1.5 Vth, when, for example, the potential of the node N4 is at a high level and the clock pulse $\phi_0$ is at a low level, i.e., 1.5 Vth, the potential of the node N5 of the next stage becomes 0.5 Vth and it is possible to keep the transistor $Q_8$ at a cut-off state. Therefore, it is possible to maintain the potential of the node N6 at a low level, i.e., $V_{SS}$. If the low level potential of the clock pulse $\phi_0$ is equal to or larger than 2 Vth, the potential of the node N6 disadvantageously rises to a value equal to or larger than $V_{SS}$ in response to the rise or fall of the clock pulse $\phi_1$. It is necessary that the low level voltage of the clock pulse $\phi_0$ be higher than Vth and lower than 2 Vth. Considering the variations in characteristics of each MIS transistor, it is preferable that the low level voltage of the clock pulse $\phi_0$ be near 1.5 Vth.

Figure 4:
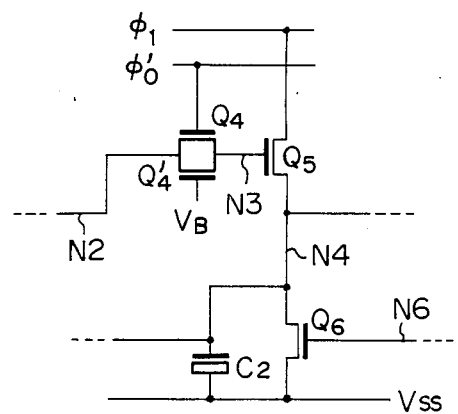
FIGS. 4 and 5 are circuit diagrams of other embodiments of the present invention, each being a modification of the shift register of FIG. 1.

FIG. 4 is a circuit of one stage of a shift register as another embodiment of the present invention. The circuit of FIG. 4 differs from that of FIG. 2 in that a transistor $Q_4'$ is connected in parallel to the input transfer gate transistor $Q_4$. A voltage $V_B$ having a voltage of approximately 1.5 Vth is applied to the gate of the transistor $Q_4'$, and the clock pulse $\phi_0$ in FIG. 2 is replaced by a clock pulse $\phi_0'$. The low level voltage of the clock pulse $\phi_0'$ is $V_{SS}$ which is the same as that of the clock pulse $\phi_1$, and the clock pulse $\phi_0'$ has the same waveform as that of a pulse formed by shifting the phase of the clock pulse $\phi_1$ by 180°. The other portions of FIG. 4 are the same as those of the circuit of FIG. 2 and are designated by the same reference symbols.

In the circuit of FIG. 4, the parallel circuit of the transistors $Q_4$ and $Q_4'$ effects the same operation as that of the transistor $Q_4$ of FIG. 2. That is, when the clock pulse $\phi_0'$ is low, the transistor $Q_4$ is turned off and the nodes N2 and N3 are connected only via the transistor $Q_4'$. Since the voltage $V_B$ of 1.5 Vth is applied to the gate of the transistor $Q_4'$, the transistor $Q_4'$ becomes equivalent to the transistor $Q_4$ when the clock pulse $\phi_0$ in the circuit of FIG. 2 is a low potential level, i.e., 1.5 Vth.

In the circuit of FIG. 4, it is not necessary to strictly regulate the voltage level of the clock pulse $\phi_0'$, and it is possible to enlarge the allowable error of the voltage level of the clock pulse $\phi_0'$.

Figure 5:
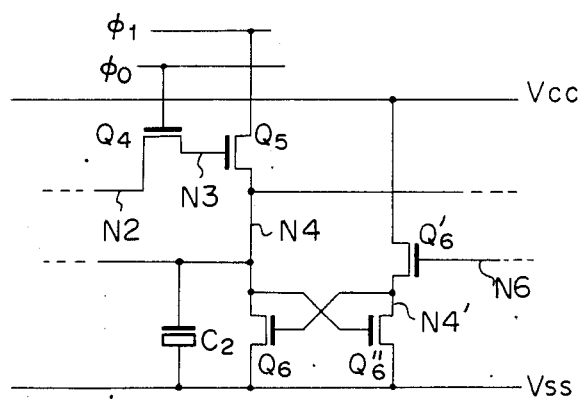

FIG. 5 is a circuit of one stage of a shift register as still another embodiment of the present invention. The circuit of FIG. 5 further comprises transistors $Q_6'$ and $Q_6''$ connected to the transistor $Q_6$ in the circuit of FIG. 2. The transistors $Q_6$ and $Q_6''$ are mutually cross-coupled at their gates and drains, and a signal from the output node N6 of the succeeding stage is input to the drain of the transistor $Q_6''$, i.e., a node N4', via the transistor $Q_6'$. The other portions are the same as those of the circuit of FIG. 2 and are designated by the same reference symbols.

In the circuit of FIG. 5, a high level voltage on the node N4 is transmitted to the succeeding stage circuit, and when the output node N6 of the succeeding circuit becomes high, the potential of the node N4', i.e., the gate of the transistor $Q_6$, becomes high, thereby clamping the potential of the node N4 to $V_{SS}$. When the potential of the succeeding output node N6 becomes low after the high level voltage of the succeeding output node N6 is transmitted to the next succeeding stage, the potential of the node N4 is low and, thus, the potential of the node N4' is still high, so that the potential of the node N4 is always clamped to the voltage $V_{SS}$ by the transistor $Q_6$. Therefore, by using the circuit of FIG. 5, it is possible to prevent the node N4 from being in an electrically floating state when the node N4 is at a low level. It is also possible to increase the reliability of the operation of a shift register, because the potential of the node N4 does not fluctuate due to noise and so on.

Figure 6:
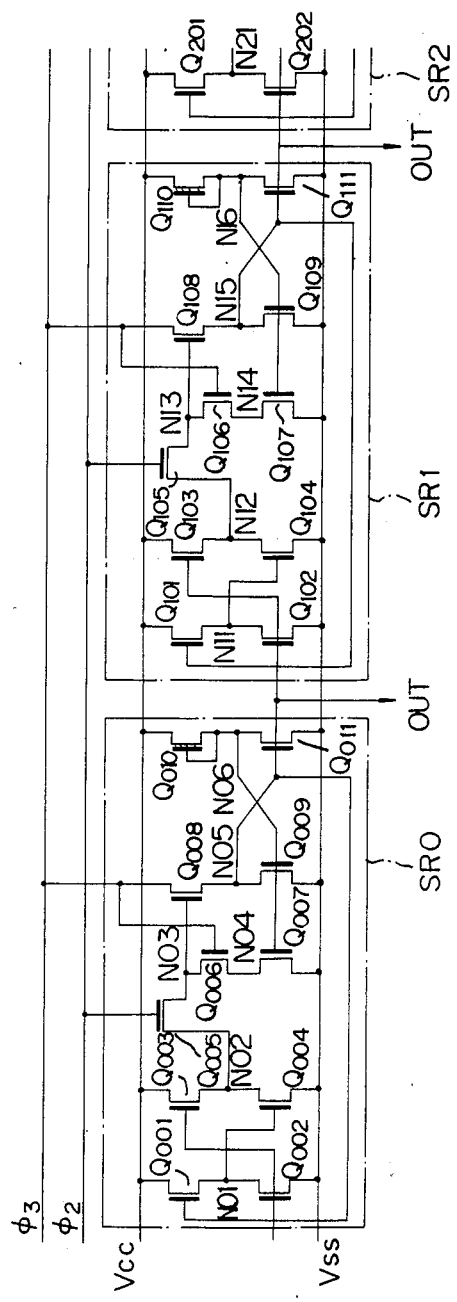
FIG. 6 is a circuit diagram of still another embodiment of the present ivnention.

FIG. 6 is a shift register of another embodiment of the present invention. Each stage of the shift register, for example, a stage SR1 comprises eleven MIS transistors $Q_{101}$, $Q_{102}$, - - -, $Q_{111}$. The transistor $Q_{110}$ is a depletion type load transistor. The transistor $Q_{101}$, - - -, $Q_{104}$ form an input circuit and a first reset means for resetting the input portion of the transistor $Q_{105}$. The transistors $Q_{106}$ and $Q_{107}$ form a second reset means which resets the output portion of the transistor $Q_{105}$. The transistors $Q_{109}$, $Q_{110}$ and $Q_{111}$ form a latch circuit which is driven by the output signal of the transistor $Q_{108}$. In the circuit of FIG. 6, nodes N05, N15, - - - correspond to the nodes N2, N4, - - - of the circuit of FIG. 2. Clock pulses $\phi_2$ and $\phi_3$ are pulses having a phase difference of, for example, 180°. The high potential level of both clock pulses $\phi_2$ and $\phi_3$ is $V_{CC}$, and the low potential level of both clock pulses $\phi_2$ and $\phi_3$ is $V_{SS}$.

Operation of the shift register of FIG. 6 is described with reference to FIG. 7. Before a time $t_0$, data "1" is stored at a circuit stage SR0, and the potential of the node N05 is high. At this time, a node N12 is already charged to a high potential level by the turned on transistor $Q_{103}$.

At the time $t_0$, the potential of the clock pulse $\phi_3$ changes from high to low. Thereby, a current flows from the node N05 to a clock line $\phi_3$ via the transistor $Q_{008}$, and the potential of the node N05 changes from high to low, i.e., the output signal of the circuit stage SR0 becomes "0". In response to the change of the potential of the node N05 to low, the transistor $Q_{011}$ is turned off, and the potential of the node N06 changes from low to high.

At a time period approximately between times $t_1$ and $t_2$, the potential of the clock pulse $\phi_2$ changes from low to high, the high level signal is transmitted from a node N12 to a node N13 via the turned on transistor $Q_{105}$, so that the potential of the node N13 becomes high. Thereafter, the clock pulse $\phi_2$ again changes from high to low.

At a time $t_3$, the clock pulse $\phi_3$ changes from low to high. Since the potential of the node N13 is high, the potential of the node N15 is pulled up via the turned on transistor $Q_{108}$, and the output data of the circuit stage SR1 becomes "1". When the potential of the node N15 becomes high, the transistor $Q_{101}$ is turned on, and the potential of a node N11 becomes high. Thereby, the transistor $Q_{104}$ is turned on, and the node N12 is reset from high to low.

In the circuit stage SR0, since the potential of the node N6 is high, the transistor $Q_{007}$ is turned on. The transistor $Q_{006}$ is also turned on because of the high potential level of the clock pulse $\phi_3$. Therefore, the potential of the node N03 is reset to low, and the transmission of data "1" from the circuit state SR0 to the circuit stage SR1 is performed.

As mentioned above, according to the present invention, it is possible to form a ring counter type shift register by using a very simple circuit structure, and to extremely shorten the occupied width of each circuit stage on a semiconductor substrate. Therefore, it becomes very advantageous to dispose the shift register in parallel to a decoder as mentioned before.

I claim:

1. A shift register having a plurality of circuit stages connected in cascade and receiving first and second clock signals different in phase from each other for driving the shift register, each of said circuit stages comprising:

a first transistor, having a source and having a drain, one of said source and drain operatively connected to receive an input signal, and having a gate operatively connected to receive the first clock signal, for transferring the input signal in response to the first clock signal;

a second transistor having a gate operatively connected to the other one of said source and drain of said first transistor, having a source and having a drain, one of said source and drain of said second transistor receiving the second clock signal, the other one of said source and drain of said second transistor providing an output signal; and a third transistor having a source, having a drain and having a gate, one of said source and drain of said third transistor being operatively connected to the other one of said source and drain of said second transistor for resetting the output signal, the other one of said source and drain of said third transistor operatively connected to a low level source of potential, said gate of said third transistor operatively connected to receive the output signal from a corresponding second transistor in a succeeding circuit stage and the terminal providing the output signal being connected to the input of said succeeding stage for resetting the input signal input to a corresponding first transistor in the succeeding circuit stage, the output signal of one of the circuit stages providing the input signal to the corresponding first transistor of the succeeding circuit stage.

2. A shift register according to claim 1, wherein each of said circuit stages further comprises a capacitor operatively connected in parallel with said third transistor.

3. A shift register according to claim 1, wherein the phases of the first and second clock signals differ from each other by approximately 180 degrees.

4. A shift register according to claim 3, wherein the first clock signal fluctuates between a power supply voltage and a voltage within the range of Vth to 2 Vth, where Vth is the threshold voltage of said first transistor.

5. A shift register according to claim 1, wherein each of said circuit stages further comprises a fourth transistor operatively connected in parallel with said first transistor and having a gate for receiving a bias voltage within the range of Vth to 2 Vth, where Vth is the threshold voltage of said first transistor.

6. A shift register according to claim 5, wherein the phases of the first and second clock signals differ from each other by approximately 180 degrees.

7. A shift register according to claim 6, wherein the voltage range of the first clock signal fluctuates between a power supply voltage and a voltage within the range of Vth to 2 Vth.

8. A shift register according to claim 1, wherein said reset means comprises:

a fourth transistor operatively connected in series with said second transistor;

a fifth transistor cross-coupled to said fourth transistor; and a sixth transistor, operatively connected in series with said fifth transistor, turning on and off in accordance with the output of the succeeding circuit stage.

9. A shift register according to claim 8, wherein each of said circuit stages further comprises a capacitor operatively connected in parallel with said fourth transistor.

* * * * *